(12) United States Patent
Lee et al.

(10) Patent No.: US 8,531,082 B2
(45) Date of Patent: Sep. 10, 2013

(54) ACTUATOR AND METHOD FOR USING THE SAME

(75) Inventors: Chih-Kung Lee, Taipei (TW); Chin-Kai Chang, Tainan (TW); Kuan-Ting Chen, Ji'an Township, Hualien County (TW); Hui-Lung Kuo, Taipei (TW); Wen-Jong Wu, Taipei (TW)

(73) Assignees: Industrial Technology Research Institute, Hsinchu (TW); Yen Tjing Ling Industrial Research Institute, National Taiwan University, Taipei (TW)

( * ) Notice: Subject to any disclaimer, the term of this patent is extended or adjusted under 35 U.S.C. 154(b) by 79 days.

(21) Appl. No.: 13/210,270

(22) Filed: Aug. 15, 2011

(65) Prior Publication Data

US 2012/0049693 A1 Mar. 1, 2012

Related U.S. Application Data

(60) Provisional application No. 61/377,541, filed on Aug. 27, 2010.

(51) Int. Cl.
*H01L 41/08* (2006.01)
(52) U.S. Cl.
USPC ............................ 310/311; 310/310; 310/330
(58) Field of Classification Search
USPC .......................................... 310/311, 321, 328
See application file for complete search history.

(56) References Cited

U.S. PATENT DOCUMENTS

| | | | |
|---|---|---|---|
| 4,524,294 A * | 6/1985 | Brody | 310/311 |
| 5,111,847 A | 5/1992 | Hu et al. | |
| 5,117,239 A | 5/1992 | Riza | |
| 5,186,699 A | 2/1993 | Dimmig | |
| 5,191,339 A | 3/1993 | Riza | |
| 5,213,163 A | 5/1993 | Schaffer | |
| 5,265,479 A | 11/1993 | Cook et al. | |
| 5,280,683 A | 1/1994 | Ping | |
| 5,307,073 A | 4/1994 | Riza | |
| 5,313,058 A * | 5/1994 | Friederich et al. | 250/214.1 |
| 5,610,578 A | 3/1997 | Gilmore | |
| 5,709,245 A | 1/1998 | Miller | |
| 5,774,259 A | 6/1998 | Saitoh et al. | |
| 5,955,687 A | 9/1999 | Miyagi et al. | |
| 6,014,477 A | 1/2000 | Barber et al. | |
| 6,049,150 A | 4/2000 | Chudleigh, Jr. | |
| 6,075,239 A | 6/2000 | Aksyuk et al. | |
| 6,170,525 B1 | 1/2001 | Takats et al. | |
| 6,235,369 B1 | 5/2001 | Shepard et al. | |
| 6,261,072 B1 | 7/2001 | Abe et al. | |
| 6,367,250 B1 | 4/2002 | Baumbick | |
| 6,388,616 B1 | 5/2002 | Zhou | |

(Continued)

OTHER PUBLICATIONS

Lee, C.K., et al.; "Modal Sensors/Actuators;" Journal of Applied Mechanics; vol. 112; Jun. 1990; pp. 434-441.

*Primary Examiner* — Mark Budd
(74) *Attorney, Agent, or Firm* — McClure, Qualey & Rodack, LLP

(57) ABSTRACT

An actuator and a method for using the same are provided. The actuator includes a flexible element and a photoelectric layer. The flexible element includes an elastic layer or a piezoelectric layer. The photoelectric layer is disposed on a side of the flexible element. An electrical characteristic of the photoelectric layer is determined according to an irradiation condition of the photoelectric layer.

24 Claims, 7 Drawing Sheets

(56) References Cited

U.S. PATENT DOCUMENTS

| | | |
|---|---|---|
| 6,422,507 B1 | 7/2002 | Lipeles |
| 6,575,401 B1 | 6/2003 | Carver |
| 6,660,202 B2 | 12/2003 | Shepard et al. |
| 6,872,433 B2 | 3/2005 | Seward et al. |
| 6,999,221 B1 * | 2/2006 | Sarkisov et al. .............. 359/244 |
| 7,228,923 B2 | 6/2007 | Takenaka et al. |
| 7,274,855 B2 | 9/2007 | Nevo et al. |
| 7,280,078 B2 * | 10/2007 | Salsman et al. ............... 343/703 |
| 7,310,460 B2 | 12/2007 | Ide et al. |
| 7,405,721 B2 | 7/2008 | Tachibana |
| 7,612,355 B2 | 11/2009 | Wu et al. |
| 7,727,771 B2 | 6/2010 | Chiou et al. |
| 8,115,693 B2 * | 2/2012 | Salsman et al. ............... 343/703 |
| 8,350,578 B2 * | 1/2013 | Sadek et al. .................. 324/633 |

* cited by examiner

ACTUATOR AND METHOD FOR USING THE SAME

This application claims the benefit of a provisional application Ser. No. 61/377,541, filed Aug. 27, 2010, the subject matter of which is incorporated herein by reference.

BACKGROUND

1. Technical Field

The disclosure relates in general to an actuator and a method for using the same, and more particularly to an actuator vibration mode of which can be adjusted by an irradiation.

2. Description of the Related Art

An actuator can be applied for various fields such as a loudspeaker, a biochip, a fluidic mixer, a vibration control unit, etc.

One type of the actuator uses a vibration sheet comprising a piezoelectric layer. A vibration mode of the actuator generated from a constant power source can be adjusted by changing a shape of the vibration sheet. However, it is difficult to change the shape of the vibration sheet at once. Therefore, the vibration mode of the actuator can not be changed immediately.

SUMMARY

An actuator is provided. The actuator includes a flexible element and a photoelectric layer. The flexible element includes an elastic layer or a piezoelectric layer. The photoelectric layer is disposed on a side of the flexible element. An electrical characteristic of the photoelectric layer is determined according to an irradiation condition of the photoelectric layer.

A method for using an actuator is provided. The actuator comprises a flexible element and a photoelectric layer. The flexible element comprises an elastic layer or a piezoelectric layer. The photoelectric layer is disposed on a side of the flexible element. The method comprising following steps. An irradiation condition to the photoelectric layer is controlled for adjusting an electrical characteristic of the photoelectric layer so as to adjust a vibration mode of the flexible element.

DETAILED DESCRIPTION

Figure 1:
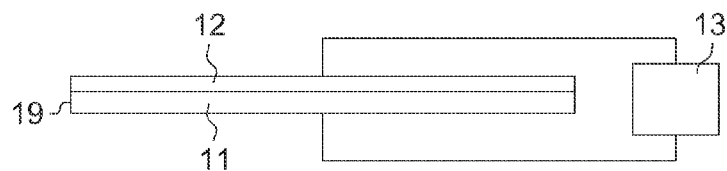
FIG. 1 shows a schematic diagram of an actuator in one embodiment.

FIG. 1 shows a schematic diagram of an actuator in one embodiment. The actuator comprises a vibration sheet 19. The vibration sheet 19 comprises a flexible element 11 and a photoelectric layer 12 disposed on a side of the flexible element 11. A vibration source 13 is connected to the flexible element 11 for vibrating the flexible element 11. The flexible element 11, the photoelectric layer 12, and the vibration source 13 may be electrically connected to each other. An electrical characteristic of the photoelectric layer 12 is determined according to an irradiation condition, such as irradiation pattern or irradiation area, of the photoelectric layer 12. A vibration mode of the flexible element 11 (or the vibration sheet 19) is determined according to the electrical characteristic of the photoelectric layer 12.

Figure 2:
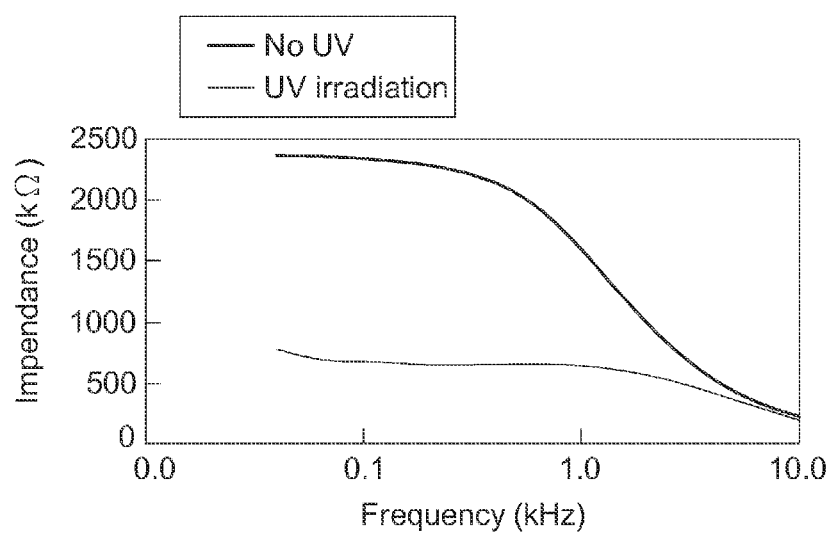
FIG. 2 illustrates a difference of impedances of the photoelectric layer with UV irradiation and without irradiation in one embodiment.

In embodiments, an impendance of the photoelectric layer 12 is determined according to an irradiation condition of the photoelectric layer 12. For example, the impendance of the photoelectric layer 12 irradiated by a light may be different from the impendance of the photoelectric layer 12 without irradiation. In some embodiments, a ratio of the impendance of the photoelectric layer 12 irradiated by a light to the impendance of the photoelectric layer 12 without irradiation is 0.01-1000. A difference of impedances of the photoelectric layer 12 with UV irradiation and without irradiation in one embodiment is shown in FIG. 2.

In embodiments, the photoelectric layer 12 comprises a photoelectric dye such as spiropyran. An electrical characteristic of the spiropyran having characteristic shown as following mechanism can be changed due to different structures generated by an irradiation.

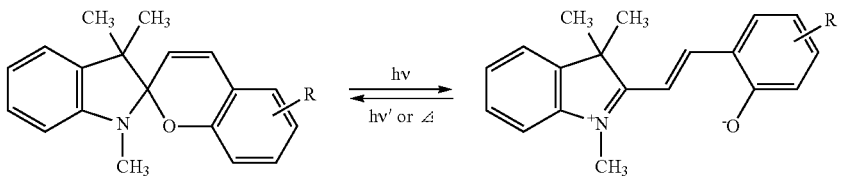

The photoelectric layer 12 may also comprise a liquid crystal molecule for aligning the photoelectric dye so that the photoelectric layer 12 would have a strong photoelectric effect. The liquid crystal molecule may comprise a chemical formula of:

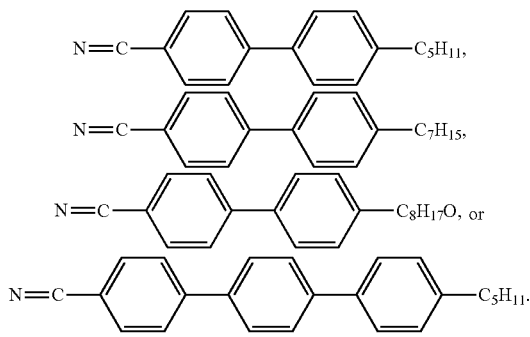

In other embodiments, the photoelectric layer 12 may comprise Cds, a-Se, ZnO, a-Si or an organic photo conductor (OPC) such as Phthalocyanine, Squaraine, Perylene pigment, etc.

The vibration source 13 comprises a shaker, a function generator, or a current source such as AC power source. The flexible element 11 comprises an elastic layer or a piezoelectric layer. The piezoelectric layer may comprise lead-zirconate-titanate (PZT), cadmium selenide, beryllium oxide, or polyvinylidene fluoride. The elastic layer may comprise steel. The piezoelectric layer may have a piezoelectric constant of −2000~2000 (pC/N), a dielectric constant of 1~6000, and a coupling coefficient of 0.01~0.9.

In some embodiments, the actuator may be set according to various designs (for example, C. K. Lee and F. C. Moon, "Modal sensors and actuators," ASME Journal of applied mechanics, 57 434-441, 1990) for obtaining a piezoelectric output of a desired mode.

Figure 3:
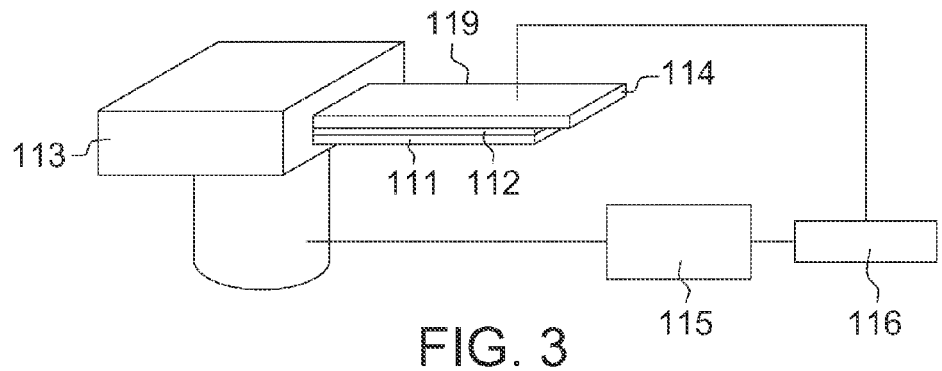
FIG. 3 shows a schematic diagram of the actuator in one embodiment.

FIG. 3 shows a schematic diagram of the actuator in one embodiment. In this embodiment, the vibration sheet 119 comprises the flexible element 111, the photoelectric layer 112, and a transparent conductive layer 114. The flexible element 111 may be an elastic layer such as spring steel. The photoelectric layer 112 may be formed by the photoelectric dye such as spiropyran. The photoelectric layer 112 may also be formed by using the liquid crystal molecule for aligning the photoelectric dye. An amplifier 115 and a spectrum signal analyzer 116 are disposed between the vibration source 113 and the transparent conductive layer 114. The amplifier 115, the spectrum signal analyzer 116, the vibration source 113 and the transparent conductive layer may be electrically connected to each other in series. The spectrum signal analyzer 116 may use SR780 provided by Stanford Research (California). The transparent conductive layer 114 may comprise ITO. For example, the vibration source 113 may be the shaker for providing a vibrating source such as sweep frequency of 0.1~1 kHz.

Figure 4:
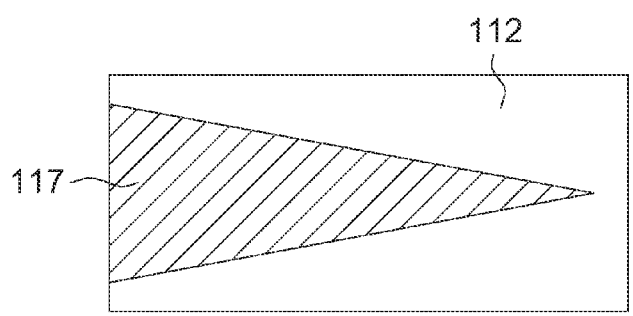
FIG. 4 illustrates an irradiation pattern provided to the photoelectric layer.
Figure 5:
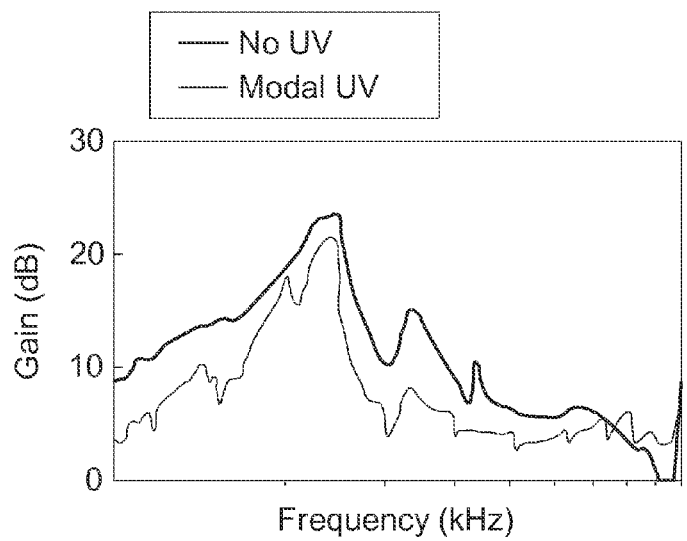
FIG. 5 shows gain curves the actuator with and without irradiation to the photoelectric layer.
Figure 6:
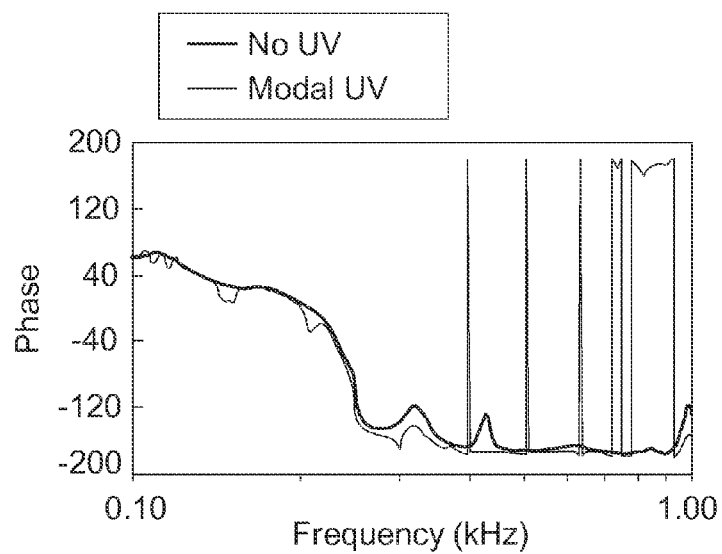
FIG. 6 shows phase curves of the actuator with and without irradiation to the photoelectric layer.

In one embodiment, the photoelectric layer 112 may be irradiated by a light source by an irradiation pattern 117 as shown in FIG. 4. From FIG. 5 and FIG. 6, respectively showing gain curves and phase curves of the actuator with (Modal UV) and without (No UV) irradiation to the photoelectric layer 112, it is found that a vibration mode of the flexible element 111 (or the vibration sheet 119) can be controlled to a desired mode. Undesired modes are quenched.

A variation degree of the electrical characteristic of the photoelectric layer would not be infinite. Therefore, a vibration signal would be affected due to a non-irradiation area of the photoelectric layer. In some embodiments, the influence due to the non-irradiation area of the photoelectric layer is eliminated by using the vibration sheet having a double-layer structure and thus having opposite strain signals respectively from opposite sides of the actuator.

Figure 7:
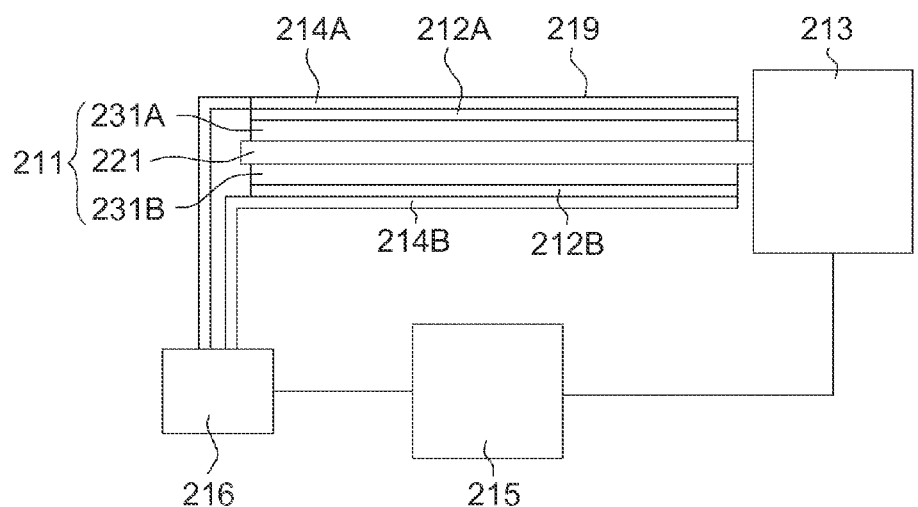
FIG. 7 shows a schematic diagram of the actuator in one embodiment.

FIG. 7 shows a schematic diagram of the actuator using the vibration sheet 219 having a double-layer structure in one embodiment. In this embodiment, the flexible element 211 may comprise the elastic layer 221 and the piezoelectric layers 231A, 231B. The piezoelectric layers 231A, 231B may be disposed on opposite sides of the elastic layer 221. The photoelectric layers 212A, 212B may be respectively disposed on opposite sides of the flexible element 211. The transparent conductive layer 214A and the transparent conductive layers 214B may be respectively disposed on the photoelectric layer 212A and the photoelectric layer 212B. The amplifier 215 and the spectrum signal analyzer 216, and the vibration source 213 may be electrically connected to each other in series. The spectrum signal analyzer 216 may be electrically connected to the transparent conductive layer 214A and the transparent conductive layer 214B.

The present disclosure is not limited to the double-layer structure as shown in FIG. 7. In some embodiment, the actuator has a single-layer structure. For example, the piezoelectric layer 231B, the photoelectric layer 212B and the transparent conductive layer 214B may be omitted for the actuator of the single-layer structure.

Figure 8:
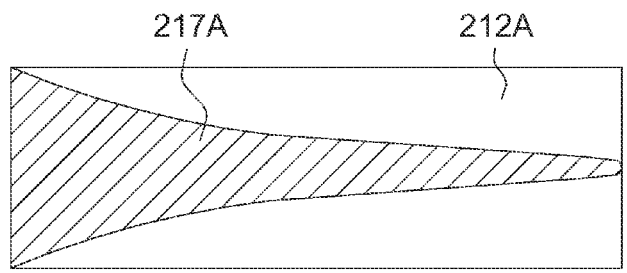
FIG. 8 illustrates an irradiation pattern provided to the photoelectric layer.
Figure 9:
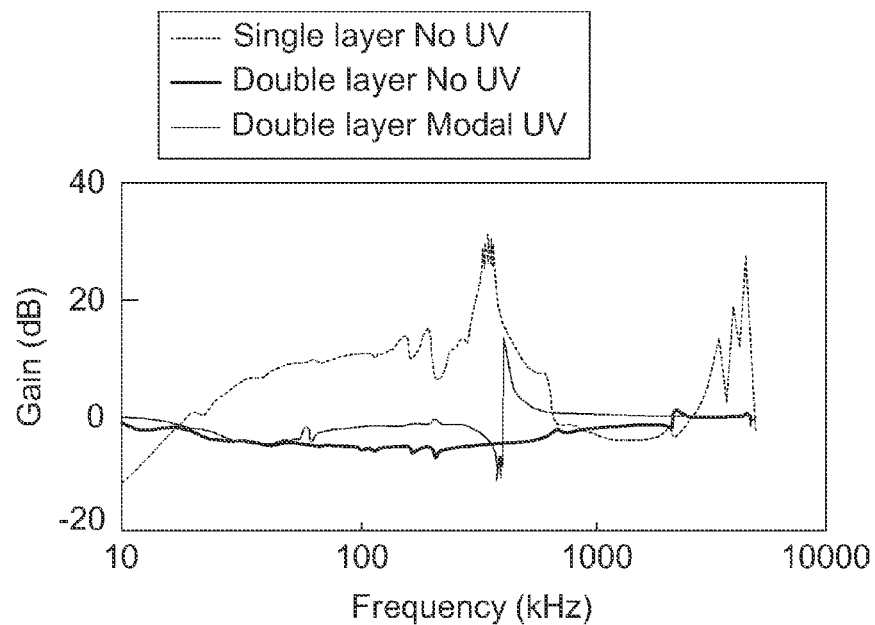
FIG. 9 shows gain curves the actuator with and without irradiation to the photoelectric layer.

In one embodiment, the photoelectric layer 212A or the photoelectric layer 212B may be irradiated by a light source by an irradiation pattern 217A as shown in FIG. 8. From FIG. 9, showing gain curves of the actuators of single-layer structure and double-layer structure with (Modal UV) and without (No UV) irradiation to the photoelectric layer 212A, it is found that a vibration mode of the flexible element 211 (or the vibration sheet 219) can be controlled to a desired mode significantly. Undesired modes are quenched.

Figure 10:
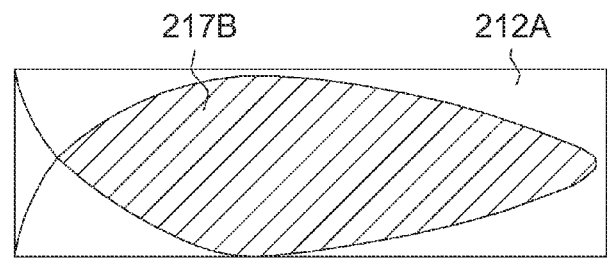
FIG. 10 illustrates an irradiation pattern provided to the photoelectric layer.
Figure 11:
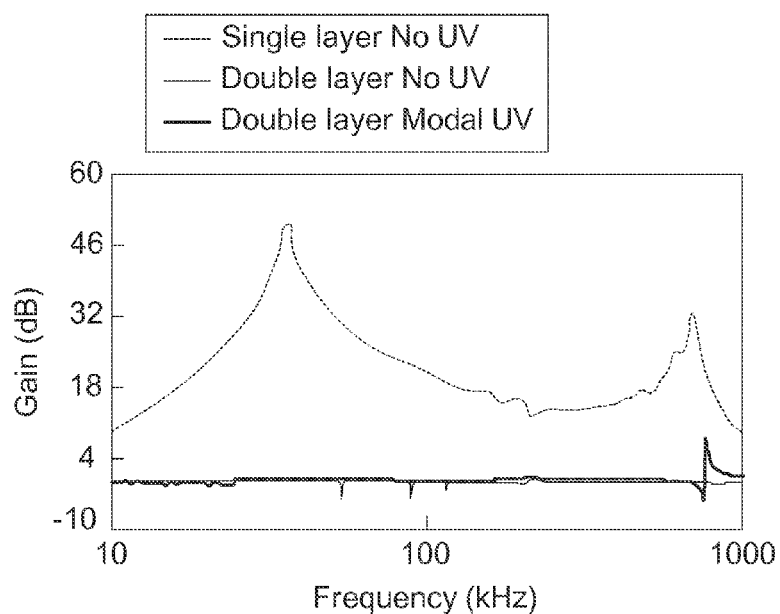
FIG. 11 shows gain curves the actuator with and without irradiation to the photoelectric layer.

In other embodiments, the photoelectric layer 212A may be irradiated by a light source by an irradiation pattern 217B as shown in FIG. 10. From FIG. 11, showing gain curves of the actuators of single-layer structure and double-layer structure with (Modal UV) and without (No UV) irradiation to the photoelectric layer 212A, it is found that a vibration mode of the flexible element 211 (or the vibration sheet 219) can be controlled to a desired mode significantly. Undesired modes are quenched.

Figure 12:
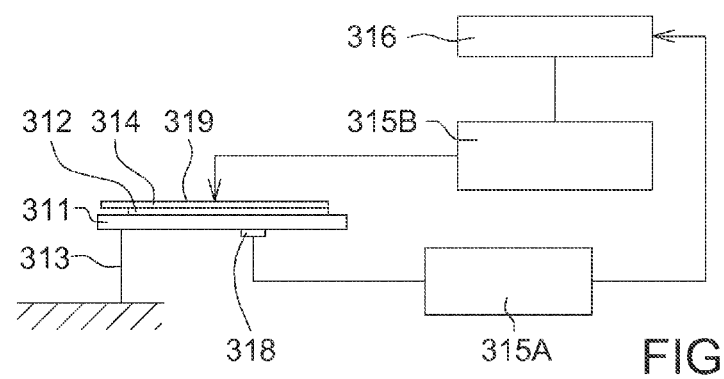
FIG. 12 shows a schematic diagram of the actuator in one embodiment.

FIG. 12 shows a schematic diagram of the actuator in one embodiment. In this embodiment, the flexible element 311 may be the piezoelectric layer. The vibration source 313 may comprise a function generator. The flexible element 311 and the transparent conductive layer 314 may be disposed on opposite sides of the photoelectric layer 312. The amplifier 315A may be electrically connected to a strain gauge 318. The amplifier 315A may comprise a charge amplifier. The amplifier 315B may be electrically connected to the transparent conductive layer 314. The amplifier 315B may comprise a power amplifier. The amplifier 315A, the amplifier 315B and the spectrum signal analyzer 316 may be electrically connected to each other in series.

Figure 13:
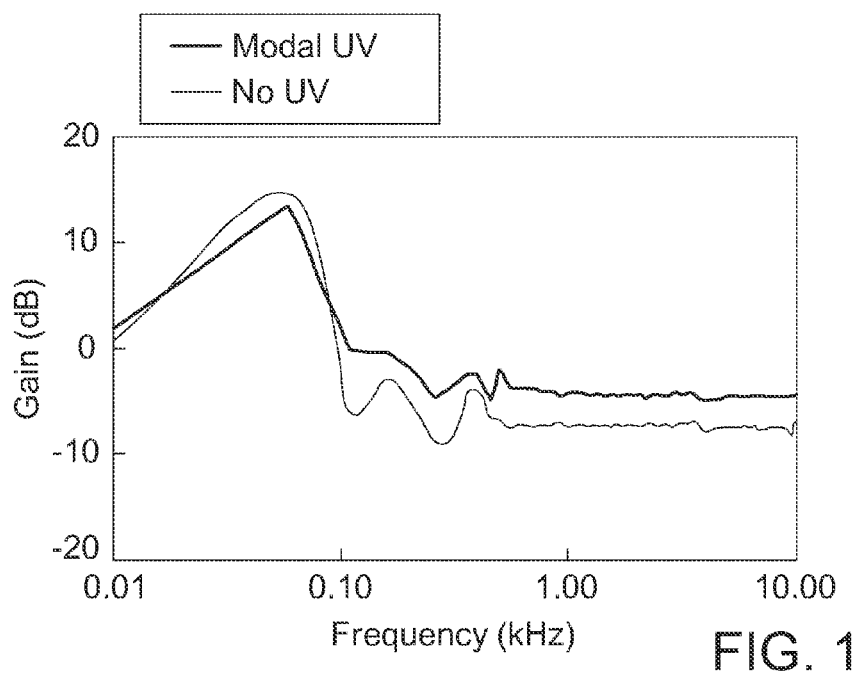
FIG. 13 shows gain curves the actuator with and without irradiation to the photoelectric layer.
Figure 14:
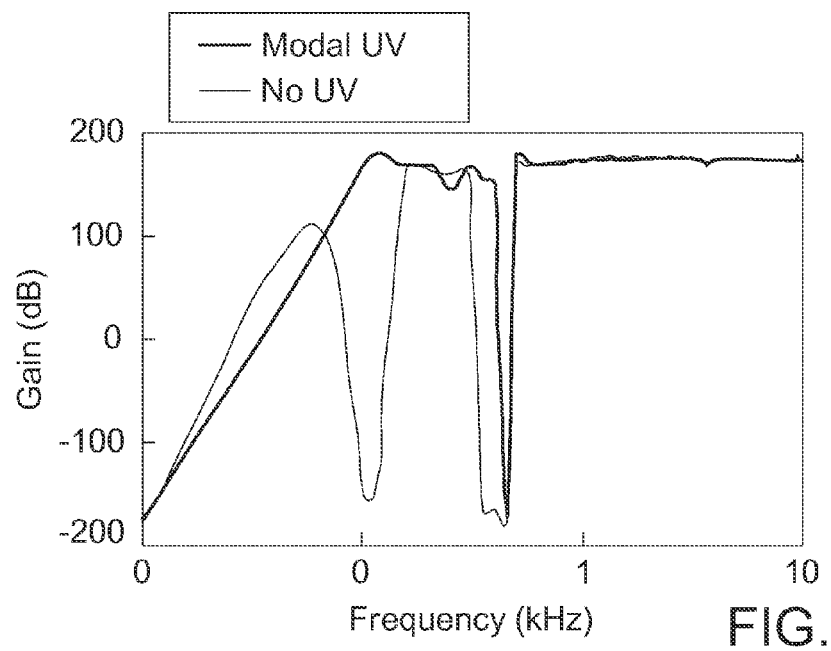
FIG. 14 shows phase curves of the actuator with and without irradiation to the photoelectric layer.

In one embodiment, the photoelectric layer 312 may be irradiated by a light source by an irradiation pattern similar to the irradiation pattern 117 as shown in FIG. 4. From FIG. 13 and FIG. 14, respectively showing gain curves and phase curves of the actuator with (Modal UV) and without (No UV) irradiation to the photoelectric layer 312, it is found that a vibration mode of the flexible element 311 (or the vibration sheet 319) can be controlled to a desired mode. Undesired modes are quenched.

In embodiments of the present disclosure, the actuator uses the photoelectric layer, the electrical characteristic of which can be determined according to an irradiation condition. Therefore, the vibration mode of the flexible element can be easily changed by controlling the irradiation condition to the photoelectric layer.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An actuator, comprising:
   a flexible element comprising an elastic layer or a piezoelectric layer; and
   a photoelectric layer disposed on a side of the flexible element, wherein an electrical characteristic of the photoelectric layer is determined according to an irradiation condition of the photoelectric layer, the photoelectric layer comprises a photoelectric dye and a liquid crystal molecule.

2. The actuator according to claim 1, wherein the flexible element comprises the elastic layer and the piezoelectric layer, the elastic layer and the photoelectric layer are disposed on opposite sides of the piezoelectric layer.

3. The actuator according to claim 1, wherein the piezoelectric layer has a piezoelectric constant of −2000~2000 (pC/N).

4. The actuator according to claim 1, wherein the piezoelectric layer has a dielectric constant of 1~6000.

5. The actuator according to claim 1, wherein the piezoelectric layer has a coupling coefficient of 0.01~0.9.

6. The actuator according to claim 1, wherein an impendance of the photoelectric layer is determined according to the irradiation condition of the photoelectric layer.

7. The actuator according to claim 1, wherein the impendance of the photoelectric layer irradiated by a light is different from the impendance of the photoelectric layer without irradiation.

8. The actuator according to claim 1, wherein a ratio of the impendance of the photoelectric layer irradiated by a light to the impendance of the photoelectric layer without irradiation is 0.01-1000.

9. The actuator according to claim 1, wherein the liquid crystal molecule is used for aligning the photoelectric dye.

10. The actuator according to claim 1, wherein the photoelectric dye comprises spiropyran.

11. The actuator according to claim 1, wherein the liquid crystal molecule comprises a chemical formula of:

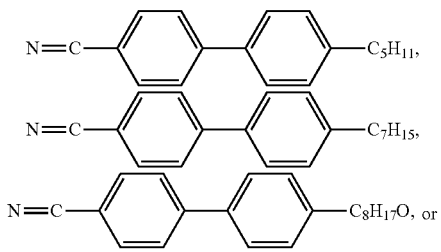

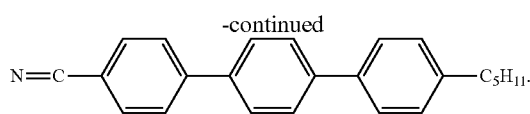

12. The actuator according to claim 1, wherein the piezoelectric layer comprises lead-zirconate-titanate (PZT), cadmium selenide, beryllium oxide, or polyvinylidene fluoride.

13. The actuator according to claim 1, wherein the elastic layer comprises steel.

14. The actuator according to claim 1, further comprising a vibration source connected to the flexible element.

15. The actuator according to claim 14, wherein the vibration source comprises a shaker, a function generator, or a current source.

16. The actuator according to claim 15, wherein the current source comprises an AC power source.

17. The actuator according to claim 1, wherein the flexible element comprises the elastic layer and a plurality of the piezoelectric layers, the piezoelectric layers are disposed on opposite sides of the elastic layer respectively.

18. A method for using an actuator, the actuator comprising:
   a flexible element comprising an elastic layer or a piezoelectric layer; and
   a photoelectric layer disposed on a side of the flexible element, wherein the photoelectric layer comprises a photoelectric dye and a liquid crystal molecule,
   the method comprising controlling an irradiation condition to the photoelectric layer for adjusting an electrical characteristic of the photoelectric layer so as to adjust a vibration mode of the flexible element.

19. An actuator, comprising:
   a flexible element comprising an elastic layer or a piezoelectric layer; and
   a photoelectric layer disposed on a side of the flexible element, wherein an electrical characteristic of the photoelectric layer is determined according to an irradiation condition of the photoelectric layer, the photoelectric layer comprises Phthalocyanine, Squaraine, Perylene pigment, spiropyran, Cds, a-Se, ZnO, or a-Si.

20. An actuator, comprising:
   a flexible element comprising an elastic layer, wherein the elastic layer comprises steel; and
   a photoelectric layer disposed on a side of the flexible element, wherein an electrical characteristic of the photoelectric layer is determined according to an irradiation condition of the photoelectric layer.

21. An actuator, comprising:
   a flexible element comprising an elastic layer or a piezoelectric layer;
   a photoelectric layer disposed on a side of the flexible element, wherein an electrical characteristic of the photoelectric layer is determined according to an irradiation condition of the photoelectric layer; and
   a vibration source connected to the flexible element.

22. A method for using an actuator, the actuator comprising:
   a flexible element comprising an elastic layer or a piezoelectric layer; and
   a photoelectric layer disposed on a side of the flexible element, wherein the photoelectric layer comprises Phthalocyanine, Squaraine, Perylene pigment, spiropyran, Cds, a-Se, ZnO, or a-Si,
   the method comprising controlling an irradiation condition to the photoelectric layer for adjusting an electrical characteristic of the photoelectric layer so as to adjust a vibration mode of the flexible element.

23. A method for using an actuator, the actuator comprising:
   a flexible element comprising an elastic layer, wherein the elastic layer comprises steel; and
   a photoelectric layer disposed on a side of the flexible element, the method comprising controlling an irradiation condition to the photoelectric layer for adjusting an electrical characteristic of the photoelectric layer so as to adjust a vibration mode of the flexible element.

24. A method for using an actuator, the actuator comprising:
   a flexible element comprising an elastic layer or a piezoelectric layer;
   a photoelectric layer disposed on a side of the flexible element; and
   a vibration source connected to the flexible element, the method comprising controlling an irradiation condition to the photoelectric layer for adjusting an electrical characteristic of the photoelectric layer so as to adjust a vibration mode of the flexible element.

* * * * *